(12) United States Patent
Shiota et al.

(10) Patent No.: US 8,036,040 B2
(45) Date of Patent: Oct. 11, 2011

(54) MEMORY SYSTEM WITH IMPROVED EFFICIENCY OF DATA TRANSFER BETWEEN HOST, BUFFER, AND NONVOLATILE MEMORY

(75) Inventors: Shigemasa Shiota, Tachikawa (JP); Hiroyuki Goto, Higashimurayama (JP); Hirofumi Shibuya, Matsuda (JP); Fumio Hara, Higashikurume (JP); Yasuhiro Nakamura, Tachikawa (JP)

(73) Assignee: Solid State Storage Solutions LLC, Madison, WI (US)

( * ) Notice: Subject to any disclaimer, the term of this patent is extended or adjusted under 35 U.S.C. 154(b) by 0 days.

(21) Appl. No.: 12/251,444

(22) Filed: Oct. 14, 2008

(65) Prior Publication Data

US 2010/0054069 A1    Mar. 4, 2010

Related U.S. Application Data

(60) Continuation of application No. 11/785,177, filed on Apr. 16, 2007, now Pat. No. 7,450,457, which is a continuation of application No. 11/082,859, filed on Mar. 18, 2005, now Pat. No. 7,206,233, which is a continuation of application No. 10/404,547, filed on Apr. 2, 2003, now Pat. No. 6,882,568, which is a division of application No. 10/341,367, filed on Jan. 14, 2003, now Pat. No. 6,744,692.

(30) Foreign Application Priority Data

Feb. 7, 2002    (JP) .................................. 2002-030191

(51) Int. Cl.
*G11C 16/06* (2006.01)
(52) U.S. Cl. ........... 365/185.2; 365/185.17; 365/185.18; 365/185.29; 365/185.3

(58) Field of Classification Search ............. 365/185.01, 365/185.33, 149, 189.04, 189.05, 220, 185.02, 365/185.17, 185.18, 185.2, 185.29, 185.3; 710/21, 33, 61
See application file for complete search history.

(56) References Cited

U.S. PATENT DOCUMENTS 5,172,338 A    12/1992 Mehrotra et al.
(Continued)

FOREIGN PATENT DOCUMENTS

JP    04-287261    10/1992
(Continued)

OTHER PUBLICATIONS

Office Action dated Jul. 2, 2009 from counterpart Korean Patent Application No. 10-2003-0004693 (with English Summary and English version of examined claims).

(Continued)

*Primary Examiner* — VanThu Nguyen
(74) *Attorney, Agent, or Firm* — Miles & Stockbridge P.C.

(57) ABSTRACT

The present invention provides a memory system which contributes to improvement in efficiency of a data process accompanying a memory access. A memory system has a rewritable nonvolatile memory, a buffer memory, and a controller. The controller controls, in response to an access request from an external apparatus, first data transfer between the controller and the external apparatus, second data transfer between the controller and the nonvolatile memory, and third data transfer between the controller and the buffer memory, controls transfer from the controller to the buffer memory in the third data transfer and transfer from the buffer memory to the controller in a time sharing manner, and enables the first data transfer or the second data transfer to be performed in parallel with the transfer carried out in the time sharing manner.

20 Claims, 14 Drawing Sheets

U.S. PATENT DOCUMENTS

| | | | |
|---|---|---|---|
| 5,198,380 | A | 3/1993 | Harari |
| 5,270,979 | A | 12/1993 | Harari et al. |
| 5,291,584 | A | 3/1994 | Challa et al. |
| 5,297,029 | A | 3/1994 | Nakai et al. |
| 5,297,148 | A | 3/1994 | Harari et al. |
| 5,307,471 | A * | 4/1994 | Ishikawa ............ 710/100 |
| 5,315,541 | A | 5/1994 | Harari et al. |
| 5,396,468 | A | 3/1995 | Harari et al. |
| 5,410,554 | A | 4/1995 | Watanabe |
| 5,422,842 | A | 6/1995 | Cernea et al. |
| 5,428,621 | A | 6/1995 | Mehrotra et al. |
| 5,430,859 | A | 7/1995 | Norman et al. |
| 5,471,478 | A | 11/1995 | Mangan et al. |
| 5,504,760 | A | 4/1996 | Harari et al. |
| 5,507,005 | A | 4/1996 | Kojima et al. |
| 5,508,971 | A | 4/1996 | Cernea et al. |
| 5,519,843 | A | 5/1996 | Moran et al. |
| 5,532,692 | A | 7/1996 | Auclair et al. |
| 5,603,062 | A | 2/1997 | Sato et al. |
| 5,764,571 | A | 6/1998 | Banks |
| 5,778,418 | A | 7/1998 | Auclair et al. |
| 6,016,549 | A | 1/2000 | Matsushiba et al. |
| 6,230,233 | B1 | 5/2001 | Lofgren et al. |
| 6,266,282 | B1 | 7/2001 | Hwang et al. |
| 6,401,149 | B1 | 6/2002 | Dennin et al. |
| 6,421,274 | B1 | 7/2002 | Yoshimura |
| 6,434,034 | B1 | 8/2002 | Wallace et al. |
| 6,522,581 | B2 | 2/2003 | Takata et al. |
| 6,590,778 | B1 | 7/2003 | Hojo et al. |
| 6,611,907 | B1 | 8/2003 | Maeda et al. |
| 6,625,716 | B2 | 9/2003 | Fackenthal |
| 6,789,192 | B2 | 9/2004 | Hirota et al. |
| 6,820,148 | B1 | 11/2004 | Cedar et al. |
| 6,922,343 | B2 | 7/2005 | Nakanishi et al. |
| 6,948,016 | B2 | 9/2005 | Cedar et al. |
| 7,143,261 | B2 | 11/2006 | Maeda et al. |
| 7,162,561 | B2 | 1/2007 | Okamoto et al. |
| 2001/0030890 | A1 | 10/2001 | Yamagami et al. |
| 2002/0083262 | A1 | 6/2002 | Fukuzumi |
| 2002/0161942 | A1 | 10/2002 | Morinaga |
| 2003/0028704 | A1 | 2/2003 | Mukaida et al. |

FOREIGN PATENT DOCUMENTS

| | | |
|---|---|---|
| JP | 05-265939 | 10/1993 |
| JP | 6-103026 | 4/1994 |
| JP | 11-191297 | 7/1999 |
| JP | 2001-357684 | 12/2001 |
| JP | 2002-024081 | 1/2002 |
| JP | 2003-233529 | 8/2003 |
| WO | WO-01/044957 | 6/2001 |

OTHER PUBLICATIONS

Decision of Rejection dated May 20, 2010 from counterpart Korean Patent Application No. 10-2003-0004693 (with English Summary and English version of claims allowed upon appeal).

* cited by examiner

| ADDRESS | MANAGEMENT AREA | USER DATA STORING AREA |
|---|---|---|
| 0 | GOOD BLOCK | USER DATA (0) |
| 1 | GOOD BLOCK | USER DATA (1) |
| 2 | GOOD BLOCK | USER DATA (2) |
| ⋮ | ⋮ | ⋮ |
| k−1 | DEFECTIVE BLOCK | INVALID DATA |
| k | GOOD BLOCK | USER DATA (k) |
| ⋮ | ⋮ | ⋮ |
| n−1 | GOOD BLOCK | USER DATA (n−1) |
| n | GOOD BLOCK | USER DATA (k−1) |

[MEMORY ADDRESS MAPPING OF FLASH MEMORY]

[HOST INTERFACE ADDRESS MAPPING]

[ADDRESS MAPPING OF SDRAM]

[OPERATION OF CPU AT THE TIME OF WRITE TRANSFER REQUEST]

[OPERATION OF CPU AT THE TIME OF READ TRANSFER REQUEST]

[FLOW OF WRITE DATA TRANSFERRING
PROCESS (WITHOUT FLASH WRITE ERROR)]

[FLOW OF WRITE DATA TRANSFERRING PROCESS (WITH FLASH WRITE ERROR)]

[FLOW OF READ DATA TRANSFERRING PROCESS]

MEMORY SYSTEM WITH IMPROVED EFFICIENCY OF DATA TRANSFER BETWEEN HOST, BUFFER, AND NONVOLATILE MEMORY

CROSS-REFERENCE TO RELATED APPLICATIONS

This application is a continuation of application Ser. No. 11/785,177 filed Apr. 16, 2007 now U.S. Pat. No. 7,450,457, which is a continuation of application Ser. No. 11/082,859 filed Mar. 18, 2005 (now U.S. Pat. No. 7,206,233), which is a continuation of application Ser. No. 10/404,547 filed Apr. 2, 2003 (now U.S. Pat. No. 6,882,568), which is a division of application Ser. No. 10/341,367 filed Jan. 14, 2003 (now U.S. Pat. No. 6,744,692).

BACKGROUND OF THE INVENTION

The present invention relates to a technique of buffering access data in a memory system for performing access control between an external interface and a nonvolatile memory in response to an access request from the outside and, for example, to a technique effectively applied to a flash memory card.

A flash memory card has a flash memory and a controller. Since the operation speed, particularly, writing or rewriting operation speed of the flash memory is lower than operation speed of a host connected to the flash memory card, the controller has a buffer memory in order to absorb the difference between the operation speeds. In response to a write request from the outside, the controller controls to input write data from the outside to the buffer memory and write the input data into the flash memory. In response to a read request from the outside, the controller temporarily stores data read out from the flash memory into the buffer memory and outputs the stored data to the outside. As a conventional buffer memory, an SRAM (Static Random Access Memory) of a relatively small capacity, a static latch, or the like is often employed.

SUMMARY OF THE INVENTION

In the case of employing an SRAM of a small capacity, however, until writing of data input from the outside to the buffer memory into the flash memory is completed, data transfer from the host to the memory card has to be waited. Until read data stored in the buffer memory from the flash memory is output to the outside, a new reading operation of the flash memory has to be waited. Particularly, in the case where writing of data into the flash memory fails, for example, when the data has to be written again to a replacing sector due to a failure in a sector to which the writing operation is performed first, the next write data from the host cannot be received by the buffer memory. Consequently, due to a problem between the flash memory and the controller, data transfer between the host and the controller has to be waited. It increases burden on the host and processing time, and a problem such that the data processing efficiency deteriorates occurs.

In a process of examining the problems, the inventor herein has recognized the existence of patent applications, although not well known, filed by the applicant herein. The patent application Nos. are 2001-174978, 2001-177924, 2001-213639, and 2001-213640. The applications provide a technique using a flash memory as a nonvolatile memory for backing up information stored in an SDRAM as a volatile memory. The SDRAM is not evaluated as a buffer memory.

An object of the present invention is to provide a memory system contributing improvement in efficiency of a data process accompanying a memory access.

Another object of the invention is to provide a memory system for performing an access control between an external interface and a nonvolatile memory in response to an access request from the outside, which can contribute to reduction in waiting time of a host in data transfer to/from the host, reduction in process load, and reduction in process time.

The above and other objects and novel features of the invention will become apparent from the description of the specification and the accompanying drawings.

Representative ones of inventions disclosed in the specification will be briefly described as follows.

[1] A memory system has a rewritable nonvolatile memory, a buffer memory, and a controller. The controller controls, in response to an access request from an external apparatus, first data transfer between the controller and the external apparatus, second data transfer between the controller and the nonvolatile memory, and third data transfer between the controller and the buffer memory, controls transfer from the controller to the buffer memory and transfer from the buffer memory to the controller in the third data transfer in a time sharing manner, and enables the first data transfer or the second data transfer to be performed in parallel with the transfer carried out in the time sharing manner.

With the above configuration, in response to a write access request from the outside, the controller stores write data to the buffer memory and outputs the write data stored in the buffer memory in a time sharing manner, in parallel with the write data storing process, can transfer write data to the nonvolatile memory by the second data transfer and, in parallel with the write data outputting process, input the following write data from the external apparatus by the first data transfer. In response to a read access request from the outside, the controller stores read data to the buffer memory and outputs the read data stored in the buffer memory in a time sharing manner, in parallel with the read data storing process, can transfer the read data to the external apparatus by the first data transfer and, in parallel with the read data outputting process, input the following read data from the nonvolatile memory by the second data transfer.

By the buffering function of the buffer memory, long waiting time is unnecessary for the timing of supplying a plurality of write data pieces by an external apparatus such as a host, and long waiting time is unnecessary for the timing of obtaining a plurality of read data pieces by the host. Therefore, the invention can contribute to reduction in waiting time of the host in the data transfer between the host and a controller, reduction in a process load, and reduction in processing time. Thus, the invention can contribute to improvement in the efficiency of a data process accompanying a memory access.

As a desired mode of the invention, in order to maximally display the buffering function, operation speed of the third data transfer is about twice as high as data transfer speed of the first data transfer. In theory, the waiting time of the host becomes zero.

As a desired mode of the invention, the buffer memory is a single-port clock-synchronous volatile memory and operates in an FIFO manner. Higher speed of the buffer memory and easy access control can be realized. The nonvolatile memory is, for example, a flash memory.

As a mode of realizing buffering between the first transfer and the third transfer and buffering between the second transfer and the third transfer, preferably, the controller has a dual-port data buffer disposed between the external apparatus and the buffer memory and a dual-port data buffer disposed between the buffer memory and the nonvolatile memory. Control for paralleling the first data transfer and the third data transfer and paralleling the second data transfer and the third data transfer is further facilitated.

[2] A memory system according to another aspect of the invention has a rewritable nonvolatile memory, a buffer memory, and a controller. The controller has: a first data transfer control unit connected to an external apparatus; a second data transfer control unit connected to the nonvolatile memory; and a transfer arbitrator which is connected to the buffer memory and controls data transfer to/from the buffer memory in response to a transfer request from the first data transfer control unit and a transfer request from the second data transfer control unit. The first data transfer control unit is connected to the external apparatus and the transfer arbitrator via a dual-port data buffer and outputs a transfer request to the transfer arbitrator. The second data transfer control unit is connected to the nonvolatile memory and the transfer arbitrator via a dual-port data buffer and outputs a transfer request to the transfer arbitrator. The transfer arbitrator controls transfer of write data to the buffer memory and transfer of read data from the buffer memory in a time sharing manner in response to a transfer request from the first data transfer control unit and a transfer request from the second data transfer control unit.

With the above configuration, the data transfer between the external apparatus and the controller is buffered by the data buffer in the first data transfer control unit, the data transfer between the nonvolatile memory and the controller is buffered by the data buffer in the second data transfer control unit, and the data transfer between both of the data buffers and the buffer memory can be performed in a time sharing manner. Therefore, in response to a write access request from the outside, the controller stores write data into the buffer memory and outputs the write data stored in the buffer memory in a time sharing manner. In parallel with the write data storing process, transfer of write data from the data buffer in the second transfer control unit to the nonvolatile memory can be performed. In parallel with the write data outputting process, the following write data from the external apparatus can be transferred to the data buffer in the first transfer control unit. In response to a read access request from the external apparatus, the controller stores read data into the buffer memory and outputs the read data stored in the buffer memory in a time sharing manner. In parallel with the read data storing process, transfer of read data from the data buffer in the first transfer control unit to the external apparatus can be performed. In parallel with the read data outputting process, the following read data from the nonvolatile memory can be transferred to the data buffer in the second transfer control unit.

By the buffering function, long waiting time is unnecessary for the timing of supplying a plurality of write data pieces by an external apparatus such as a host, and long waiting time is unnecessary for the timing of obtaining a plurality of read data pieces by the host. Therefore, the invention can contribute to reduction in waiting time of the host in the data transfer between the host and a controller, reduction in a process load, and reduction in processing time. Thus, the invention can contribute to improvement in the efficiency of a data process accompanying a memory access.

As a concrete mode of the invention, in response to a write access request from the outside, the first data transfer control unit outputs a transfer request for writing data to the buffer memory to the transfer arbitrator when a predetermined amount of data is stored in the data buffer from the external apparatus, and the second data transfer control unit outputs a transfer request for reading data from the buffer memory to the data buffer to the transfer arbitrator when data in the data buffer is less than the predetermined amount. In response to a read access request from the outside, the second data transfer control unit outputs a transfer request for writing data to the buffer memory to the transfer arbitrator when a predetermined amount of data is stored in the data buffer from the buffer memory, and the first data transfer control unit outputs a transfer request for reading data from the buffer memory to the transfer arbitrator when data in the data buffer is less than the predetermined amount.

As a desired mode of the invention, in order to maximally display the buffering function, preferably, operation speed of the data transfer to/from the buffer memory by the transfer arbitrator is about twice as high as operation speed of data transfer to/from the outside by the first transfer control unit. In theory, the waiting time of the host becomes zero.

As a desired mode of the invention, the buffer memory is a single-port clock-synchronous volatile memory and operates in an FIFO manner. Higher speed of the buffer memory and easier access control can be realized. The nonvolatile memory is, for example, a flash memory.

DETAILED DESCRIPTION OF THE PREFERRED EMBODIMENTS

Figure 1:
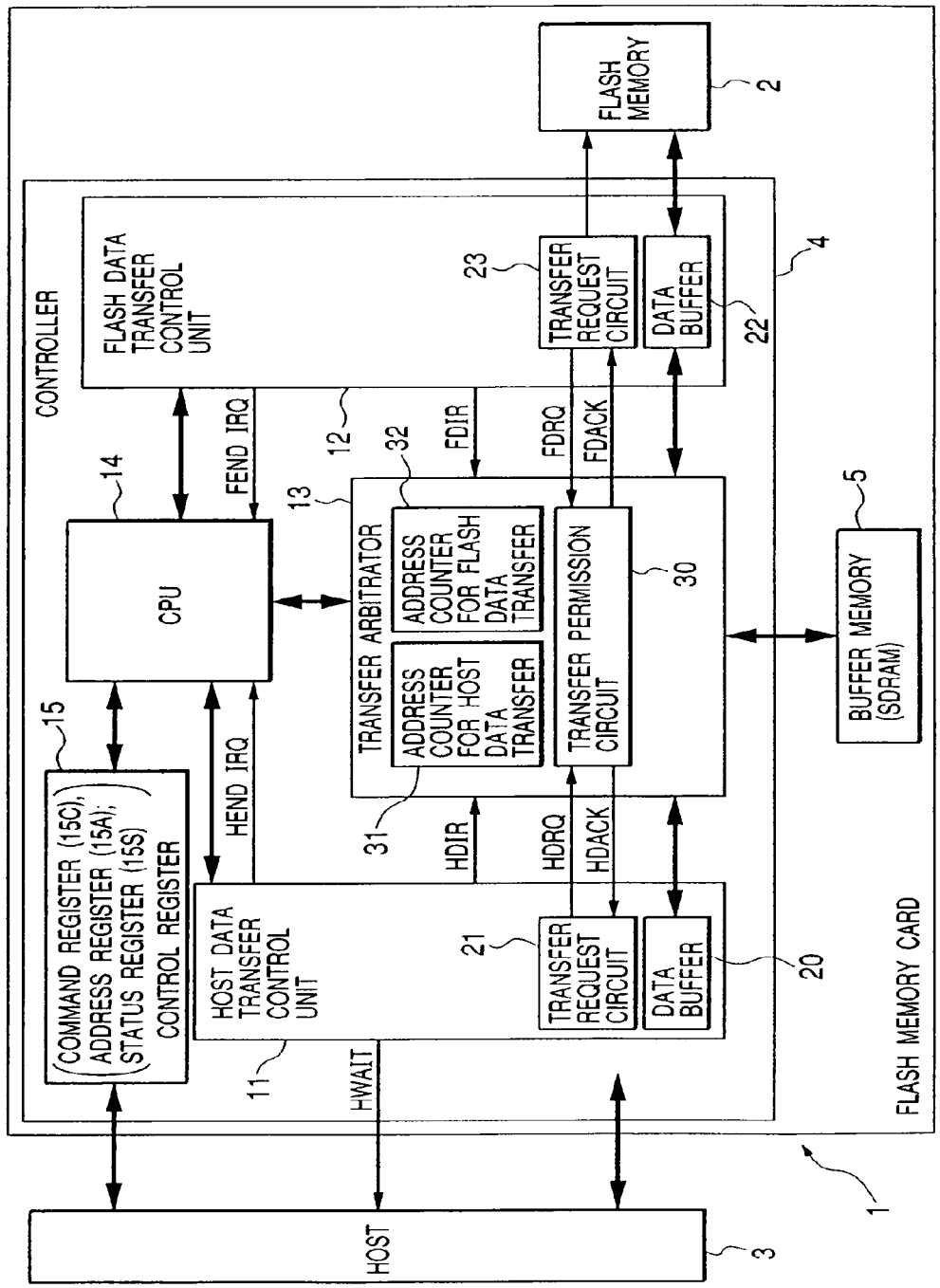
FIG. 1 is a block diagram of a flash memory card as an example of a memory system according to the invention.

FIG. 1 shows a memory flash card as an example of a memory system according to the invention. A flash memory card 1 has a flash memory (nonvolatile memory) 2 having a data storage area and an area for managing the data storage area for each predetermined sector address (physical address), a controller 4 for controlling an access to the flash memory 2 in response to a request from an external information processor, for example, a host 3, connected on the outside of the memory system, and a buffer memory 5 connected to the controller 4.

The flash memory 2 has, although not particularly shown, a memory cell array in which electrically erasable and writable flash memory cells are arranged in a matrix. The flash memory cell has, although not limited, a floating gate and a control gate isolated from each other via an insulating film on a channel region. For example, by injecting hot electrons into the floating gate, the threshold voltage of the memory cell is increased (this operation is called, for example, writing). By discharging electrons injected in the floating gate by a tunneling current via a gate insulating film, the threshold voltage of the memory cell is lowered (this operation is called erasing). The drain of the flash memory cell is connected to a bit line, the source is connected to a source line, and the control gate is connected to a word line. For example, an address assigned to the word line is the sector address Selection of a word line by a sector address signal is performed by a word line selecting circuit. A part of a plurality of flash memory cells designated by a sector address is selected on the basis of a column address signal generated by a column address counter by using a column address as a starting point. The flash memory can employ, for example, the configuration disclosed in Japanese Unexamined Patent Application No. 2001-23383.

Figures 2, 3:
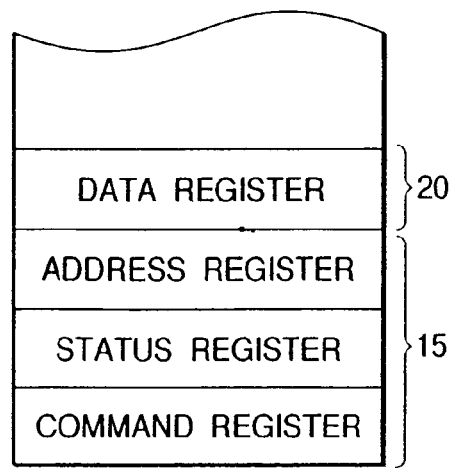
FIG. 2 is a diagram showing local memory address mapping of a flash memory functioning as a file memory.
FIG. 3 is an explanatory diagram generally showing address mapping of a host interface part of a controller.

The flash memory 2 functions as, for example, a file memory. In local memory address mapping, as shown in FIG. 2, a management area and a user data storing area are assigned to each of sector addresses 1 to n and information such as whether each sector is good (valid) or not and further the presence/absence of a spare is stored in the management area.

The buffer memory 5 takes the form of, for example, a single-port SDRAM (Synchronous Dynamic Random Access Memory) as a clock synchronous volatile memory. The buffer memory 5 will be also simply described as SDRAM 5. The SDRAM 5 has, for example, a memory cell array in which dynamic memory cells are arranged in a matrix, receives a command, an address, and the like synchronously with clocks, and can perform a write access, a read access, or the like designated by a command synchronously with clock signals at high speed. For example, when it is assumed that the speed of a data transfer (first data transfer) via a bus between the host 3 and the controller 4 is 100 MB (megabytes)/sec, the speed of a data transfer (third data transfer) via a bus between the SDRAM 5 and the controller 4 is 266 MB/sec which is more than twice as high as that of the first data transfer. The speed of a data transfer (second data transfer) via a bus between the flash memory 2 and the controller 4 is about 20 MB/sec so as to be matched with access speed of the flash memory 2 itself which is low.

The controller 4 is constructed by a host data transfer control unit (first data transfer control unit) 11, a flash data transfer control unit (second data transfer control unit) 12, a transfer arbitrator 13, a CPU 14, and a control register 15.

The control register 15 has a command register (15C), an address register (15A), and a status register (15S). At the time of accessing the flash memory card 1, the host 3 sets a read or write command in the command register 15C and sets an access address in the address register 15A. States of the host 3 and the flash memory card 1 are mutually recognized via the status register 15S.

The CPU 14 generally controls the flash memory card 1. When a command is set in the command register 15C, the CPU 14 interprets the command, and performs a control on a memory interface with the flash memory 2, a control on a data interface with the host 3, a buffer control on data subjected to the interface control, and the like, thereby completing an access to a sector in the flash memory 2 corresponding to the address set in the address register 15A.

The host data transfer control unit 11 connects the host 3 and the transfer arbitrator 13 via a dual-port data buffer 20. When a transfer request circuit 21 sends a transfer request to the transfer arbitrator 13 by a signal HDRQ, and receives acknowledgment by a signal HDACK, the data buffer 20 inputs/outputs data from/to the transfer arbitrator 13. The inputting or outputting operation is instructed to the transfer arbitrator 13 by the host data transfer control unit 11 by using a signal HDIR. The signal HDIR is set in the host data transfer control unit 11 before the CPU 14 starts a transferring operation. When an amount of the input or output operation to/from the transfer arbitrator 13 of the data buffer 20 started in response to the acknowledge by the signal HDACK reaches a specific amount, the host data transfer control unit 11 asserts a signal HEND_IRQ to the CPU and finishes the transfer operation. The CPU 14 allows the transfer arbitrator 13 to accept a new transfer request. The host data transfer control unit 11 can instruct the host 3 to stop the operation by outputting a wait signal HWAIT to the host 3 and asserting the signal.

Although not shown, whether the transfer operation between the data buffer 20 and the host 3 can be performed or not is determined by exchanging the status via the status register 15S. When seen from the host 3, the data buffer 20 is mapped in its address space. FIG. 3 shows general address mapping of the host interface part of the controller 4.

The flash data transfer control unit 12 connects the flash memory 2 and the transfer arbitrator 13 via a dual-port data buffer 22. The data buffer 22 takes the form of a dual-port FIFO buffer. When a transfer request circuit 23 sends a transfer request to the transfer arbitrator 13 by a signal FDRQ and receives acknowledgment by a signal FDACK, the data buffer 22 inputs/outputs data from/to the transfer arbitrator 13. The inputting/outputting operation is instructed by the flash data transfer control unit 13 to the transfer arbitrator 13 by using a signal FDIR. The signal FDIR is set in the flash data transfer control unit 12 before the CPU 14 starts transferring operation. When an amount of the inputting/outputting operation to the transfer arbitrator 13 of the data buffer 22 started in response to the acknowledgment by the signal FDACK reaches a specific amount, the flash data transfer control unit 12 asserts a signal FEND_IRQ to the CPU and finishes the transfer operation. In response to this, the CPU 14 allows the transfer arbitrator 13 to accept a new transfer request. Although not shown, the flash data transfer control unit 12 determines whether the transfer operation between the data buffer 22 and the flash memory 2 can be performed or not by exchanging the status via the status register of the flash memory 2.

Figure 4:
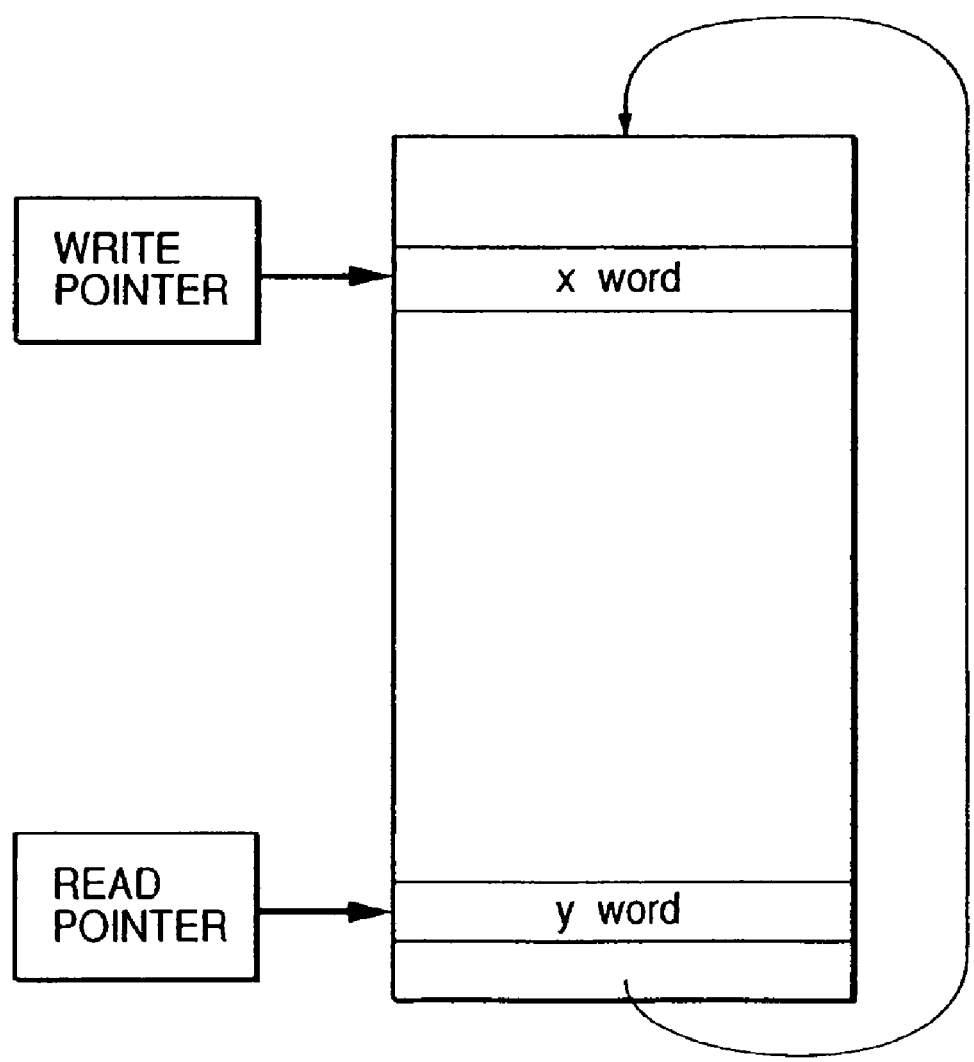
FIG. 4 is an explanatory diagram showing an FIFO form of an SDRAM.

The transfer arbitrator 13 is constructed by a transfer permission circuit 30, an address counter 31 for host data transfer, and an address counter 32 for flash data transfer. The address counter 31 for host data transfer generates an access address of the SDRAM 5 in data transfer between the data buffer 20 and the buffer memory 5. The address counter 32 for flash data transfer generates an access address of the SDRAM 5 in data transfer between the data buffer 22 and the flash memory 2. An address is preset in the address counters 31 and 32 by the CPU 14 in response to an access request from the host 3. The access to the SDRAM 5 is controlled in an FIFO manner as illustrated in FIG. 4. The address counter 31 for host data transfer functions as a write address pointer at the time of writing data from the data buffer 20 to the SDRAM 5 and functions as a read address pointer at the time of reading data from the SDRAM 5 to the data buffer 20. The address counter 32 for flash data transfer functions as a write address pointer at the time of writing data from the data buffer 22 to the SDRAM 5 and functions as a read address pointer at the time of reading data from the SDRAM 5 to the data buffer 22. The transfer permission circuit 30 arbitrates competition between the transfer request signals HDRQ and FDRQ and returns a result of the arbitration to the transfer request circuits 21 and 23 by the signals HDACK and FDACK.

Figure 5:
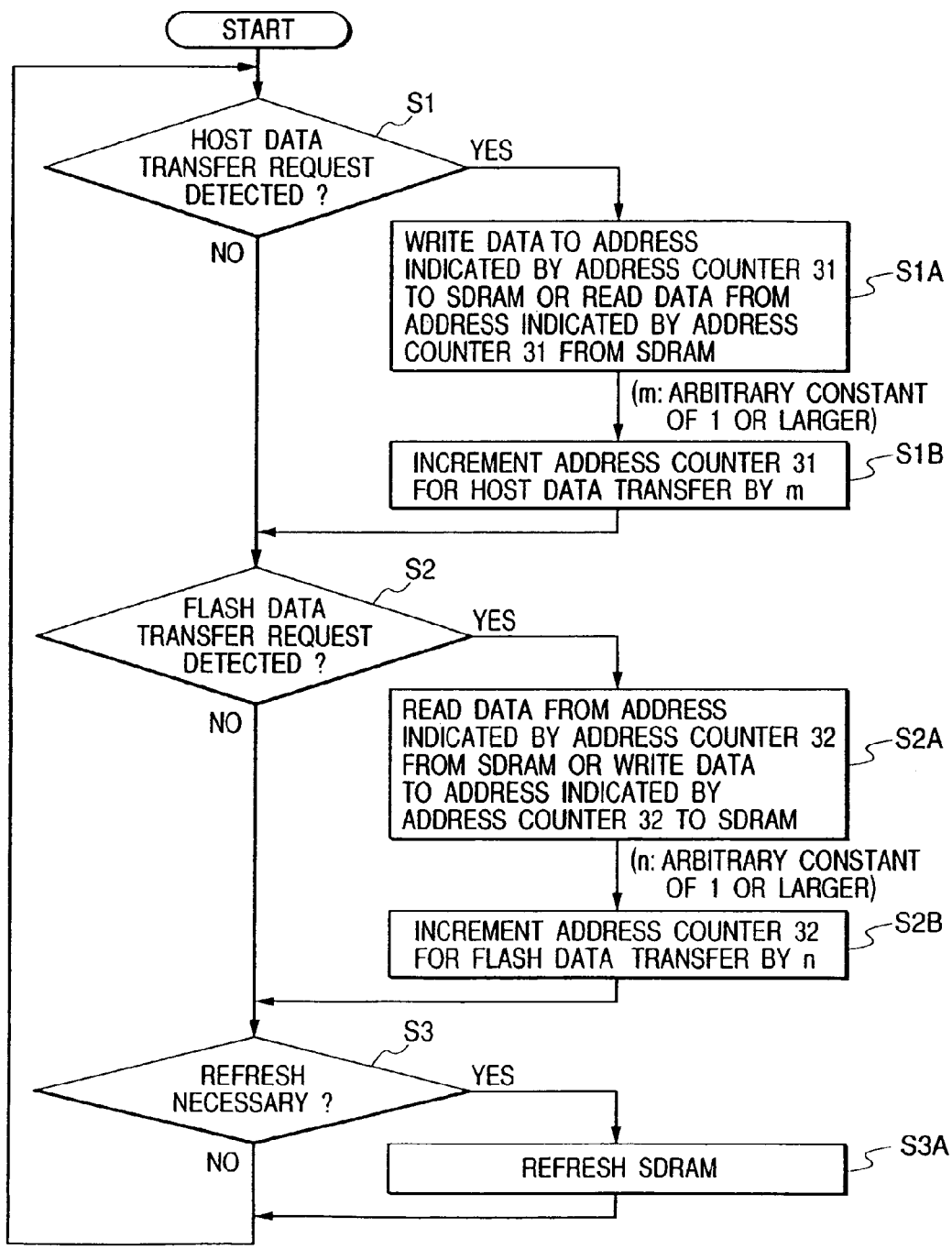
FIG. 5 is a flowchart illustrating a control operation performed by a transfer arbitrator.

FIG. 5 illustrates the control operation by the transfer arbitrator 13. The transfer arbitrator 13 sequentially cyclically determines whether there is a host data transfer request by the signal HDRQ (S1), whether there is a flash data transfer request by the signal FDRQ or not (S2), and whether it is necessary to refresh or not (S3). In the case where there is the host data transfer request by the signal HDRQ, in a process responding to a write access request from the host 3, data is written to an address in the SDRAM 5 indicated by the address counter 31 and, in a process responding to a read access request from the host 3, data is read from an address in the SDRAM 5 indicated by the address counter 31 (S1A). After that, the address counter 31 is incremented (S1B). In the case where there is a flash data transfer request by the signal FDRQ, in a process responding to the write access request from the host 3, data is read from an address in the SDRAM 5 indicated by the address counter 32 and, in a process responding to a read access request from the host 3, data is written into an address in the SDRAM 5 indicated by the address counter 32, and the address counter 32 is incremented. When it is determined that refreshing is necessary, information stored in the SDRAM 5 is refreshed. A refresh address is generated by a not-shown refresh address counter of the transfer arbitrator 13.

As obviously understood from FIG. 5, in the process performed in response to the write access request from the host 3, writing to the address in the SDRAM 5 indicated by the address counter 31 and reading of data from the address in the SDRAM 5 indicated by the address counter 32 can be performed in a time sharing manner, that is, alternately on an 8-byte unit basis or the like. In the process responding to the read access request from the host 3, reading of data from the address in the SDRAM 5 indicated by the address counter 31 and writing of data to the address in the SDRAM 5 indicated by the address counter 32 can be performed in a time sharing manner, that is, alternately on the 8-byte unit basis or the like.

Figure 6:
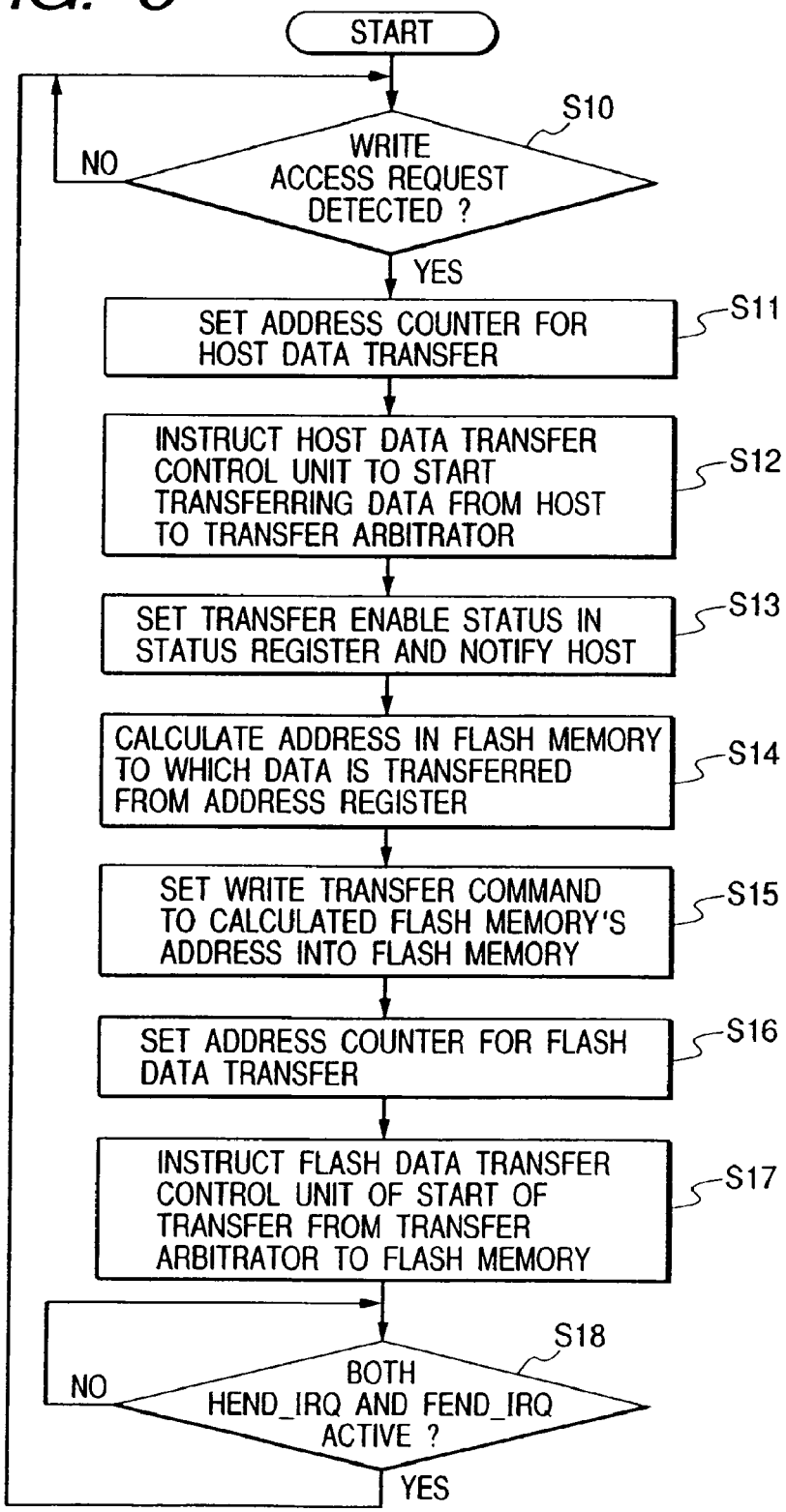
FIG. 6 is a flowchart showing a control operation of a CPU at the time of a write transfer request.

FIG. 6 illustrates a control operation of the CPU when the write transfer request is received. When a write access request from the host 3 is detected (S10) the CPU 14 sets the address counter 31 for host data transfer, that is, initializes or presets an initial value (S11). Further, the CPU 14 instructs the host data transfer control unit 11 to transfer data to be input from the host 3 to the data buffer 20 to the transfer arbitrator 13 (S12). After that, the CPU 14 sets a transfer enable status in the status register 15S and notifies the host 3 of start of transfer of write data to the data buffer 20 (S13). The transfer arbitrator 13 consequently performs the process which is carried out in response to the host transfer request (S1) described by referring to FIG. 5, thereby enabling the data to be stored into the SDRAM 5 designated by the address counter 31 each time 8-byte data is input from the host 3 to the data buffer 20. Further, the CPU 14 calculates a physical address, that is, a sector address in the flash memory 2 from the access address input to the address register 15A (S14) and sets a command to write data into the calculated sector address into the flash memory 2 via the flash data transfer control unit 4 (S15). After that, the CPU 14 sets the address counter 32 for flash data transfer, that is, initializes or presets an initial value (S16). Each time 8-byte data is input from the SDRAM 5 to the data buffer 22, the CPU 14 instructs the flash data transfer control unit 12 to enable the data to be transferred to the flash memory 2 (S17). During this period, the transfer arbitrator 13 performs the process which is carried out in response to the flash data transfer request (S2) described by referring to FIG. 5, thereby transferring the data stored in the SDRAM 5 to the data buffer 22 in accordance with the value of the address counter 32 so that the data held in the data buffer 22 becomes eight bytes.

When the process responding to the host data transfer request in FIG. 5 and the process responding to the flash data transfer request are repeated in a time sharing manner, the CPU 14 detects a state where both the signals HEND_IRQ and FEND_IRQ are active (S18) and enters a write access request waiting mode (S10). Specifically, when data according to the number of write data pieces to be written in response to the write access request made by the host 3 is stored in the SDRAM 5, the signal HEND_IRQ is made active. When data according to the number of write data to be written is read from the SDRAM 5, the signal FEND_IRQ is made active.

Figure 7:
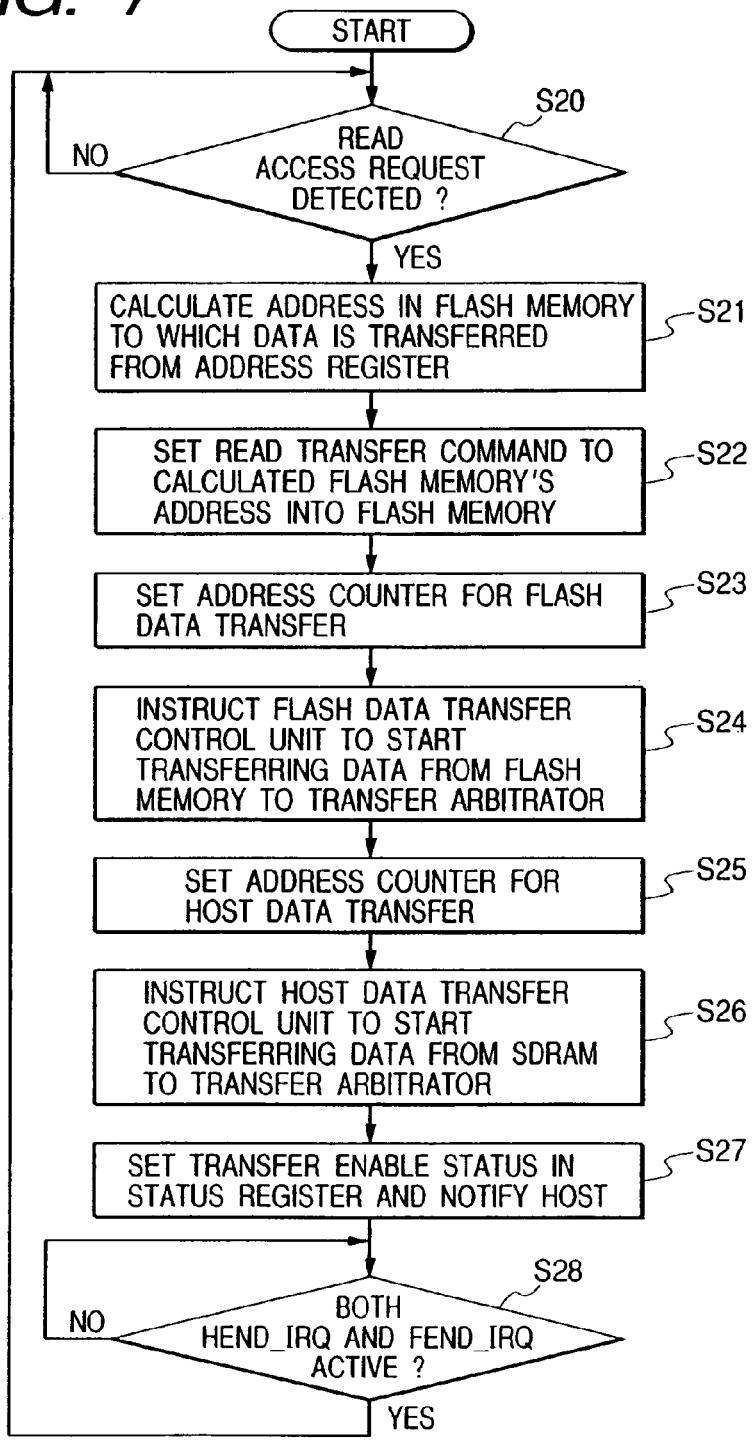
FIG. 7 is a flowchart showing a control operation of a CPU at the time of a read access request.

FIG. 7 illustrates the control operation of the CPU performed in response to the read access request. When a read access request from the host 3 is detected (S20), the CPU 14 calculates a physical address, that is, a sector address in the flash memory 2 from the access address input to the address register 15A (S21), and sets a read command to the calculated sector address into the flash memory 2 via the flash data transfer control unit 4 (S22). The CPU 14 sets the address counter 32 for flash data transfer, that is, initializes or presets the initial value (S23). Further, the CPU 14 instructs the flash data transfer control unit 12 to transfer data which is input from the flash memory 2 to the data buffer 22 to the transfer arbitrator 13 (S24). By performing a process which is carried out in response to the flash data transfer request (S2) described by referring to FIG. 5, for example, each time 8-byte data is input from the flash memory 2 to the data buffer 22, the transfer arbitrator 13 enables the data to be stored into the SDRAM 5 designated by the address counter 32. After that, the CPU 14 sets the address counter 31 for host data transfer, that is, initializes or presets an initial value (S25). The CPU 14 instructs the host data transfer control unit 11 to read out data from the SDRAM 5 and supply the data to the data buffer 20 (S26). The CPU 14 sets a transfer enable status in the status register 15S and notifies the host 3 of the fact that the read data can be fetched (S13). The transfer arbitrator 13 performs the process which is carried out in response to the host transfer request (S1) that has been described by referring to FIG. 5 to transfer the data stored in the SDRAM 5 into the data buffer 20 in accordance with the value of the address counter 31 so that the data held by the data buffer 20 becomes eight bytes.

When the process performed in response to the host transfer request in FIG. 5 and the process performed in response to the flash data transfer request are repeated in a time sharing manner, the CPU 14 detects a state in which both of the signals HEND_IRQ and FEND_IRQ are active (S28), and enters a read access request waiting mode (S20). Specifically, when data according to the number of data to be read in response to the read access request instructed by the host 3 is stored in the SDRAM 5, the signal FEND_IRQ is made active. When data according to the number of data to be read is read from the SDRAM 5, the signal HEND_IRQ is made active.

Figure 8:
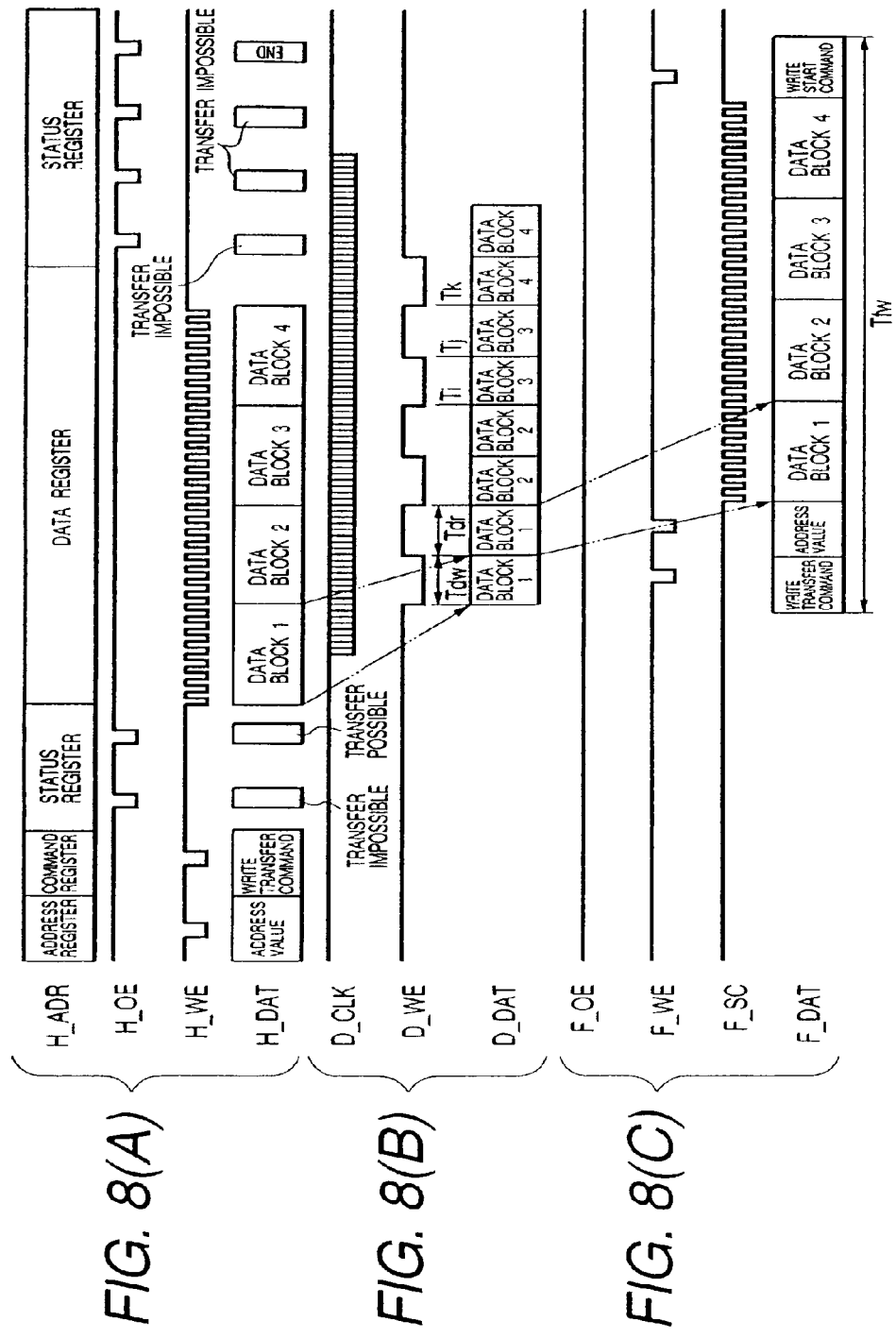
FIG. 8 is a timing chart showing a correlation of data transfer operations among a host, an SDRAM, and a flash memory when a write access request is received.

FIG. 8 shows the correlation of data transfer operations of the host 3, SDRAM 5, and flash memory 2 when a write access request is received. (A) shows the operation state of the host 3, (B) shows the operation state of the SDRAM 5, and (C) shows the operation state of the flash memory 2. Shown are an address bus H_ADR connected from the host 3 to the controller 4, a data bus H_DAT for connecting the host 3 and the controller 4, a write enable signal H_WE output from the host 3, an output enable signal H_OE output from the host 3, a sync clock signal D_CLK supplied to the SDRAM 5, a write enable signal D_WE supplied from the controller 4 to the SDRAM 5, a data bus D_DAT for connecting the controller 4 and the SDRAM 5, an output enable signal F_OE which is output from the controller 4 to the flash memory 2, a write enable signal F_WE supplied from the controller 4 to the flash memory 2, a serial clock signal F_CS output from the controller 4 to the flash memory 2, and a data bus F_DAT connecting the controller 4 and the flash memory 2.

The host 3 outputs an address value to the address register 15A in the controller 4 and a write transfer command to the command register 15C in the controller 4 and reads the status set in the status register 15S of the controller 4. After reading a transfer enable status, the host 3 transfers data to the data register in the data buffer 20. The data transfer is performed on a block unit basis and each block consists of, for example, eight bytes. The controller 4 gives the flash memory 2 a sector address value for writing and a write transfer command When data of a data block 1 is received, the controller 4 writes the data into the SDRAM 5. A write cycle at this time is indicated by Tdw. The data of the data block 1 written is read from the SDRAM 5 to the controller 4. A read cycle at this time is indicated by Tdr. The data of the data block 1 read to the controller 4 is transferred to the flash memory 2. While the SDRAM 5 performs the write cycle Tdw and the read cycle Tdr on the data of the data block 1, the host 3 outputs data of the following data block 2 toward the buffer 20 in the controller 4. When the data of the data block 1 is transferred to the flash memory 2, the write cycle and the read cycles on the data of the data block 2 are performed by the SDRAM 5 in a time sharing manner. A process similar to the above is performed on data up to a data block 4.

According to the example, when the controller 4 reads the data of the data block 3 from the port on the transfer arbitrator 13 side of the data buffer 20, stores it into the SDRAM 5 (Ti to Tj) and, subsequently, stores the data stored in the SDRAM 5 into the data buffer 22 from the port on the transfer arbitrator 13 side (Tj to Tk), the data of the following data block 4 is input to the data buffer 20 from the port on the host 3 side of the data buffer 20 and the data of the data block 2 preceding to the data block 3 is transferred to the flash memory 2 from the port on the flash memory 2 side of the data buffer 22. In short, in response to a write access request from the host 3, the controller 4 stores write data to the SDRAM 5 and outputs the write data stored in the SDRAM 5 in a time sharing manner. In parallel with the process of storing write data into the SDRAM 5, the write data can be transferred to the flash memory 2. In parallel with the process of outputting the write data from the SDRAM 5, the next write data can be input from the host 3.

In the example of FIG. 8, a write command sequence to the flash memory 2 includes the address value (sector address value), write transfer command, write data (data blocks 1 to 4), and write start command. On condition that the write start command is input, the flash memory 2 interprets information which has been input just moments before that as a command sequence and, in accordance with the result, starts the writing operation in the flash memory 2. In FIG. 8, a command sequence supply cycle from the input of the address value to the input of the write start command is indicated as Tfw.

Figure 9:
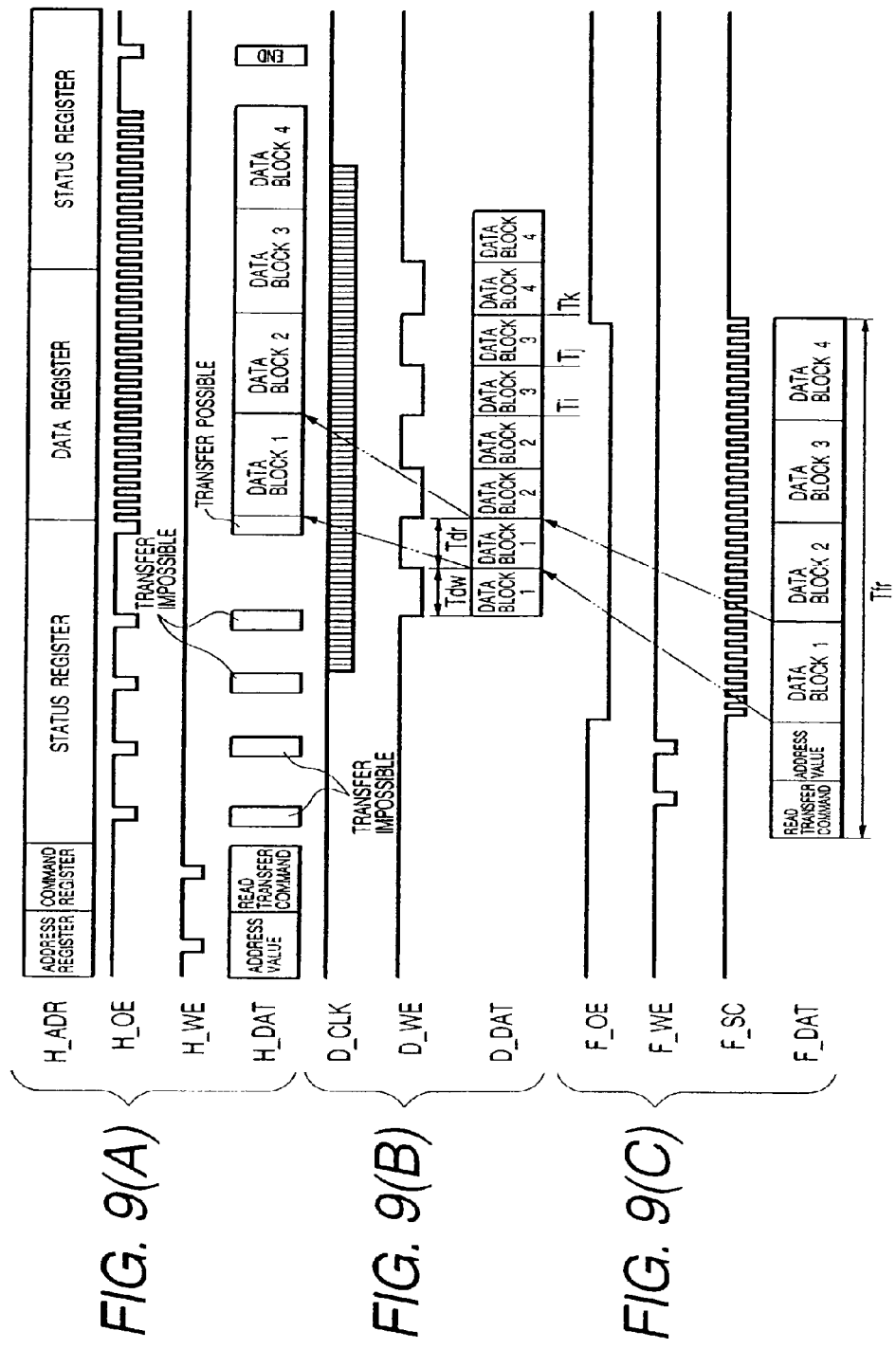
FIG. 9 is a timing chart showing a correlation of data transfer operations among the host, SDRAM, and flash memory when a read access request is received.

FIG. 9 shows the correlation of data transferring operations of the host, SDRAM, and flash memory when the read access request is received. (A) shows the operation state of the host 3, (B) shows the operation state of the SDRAM 5, and (C) shows the operation state of the flash memory 2.

The host 3 outputs an address value to the address register 15A and a read transfer command to the command register 15 in the controller 4. The controller 4 supplies the address value and the flash read transfer command to the flash memory 2. In response to the command, the flash memory 2 sequentially reads out the data in the data blocks 1 to 4 synchronously with the clock signal F_CS. In FIG. 9, the read cycle is indicated as Tfr. The data of the data block 1 which is read first is written into the SDRAM 5 via the data buffer 22. The write cycle is indicated as Tdw. Further, the written data of the data block 1 is read out from the SDRAM 5 and supplied to the data buffer 20. The read cycle is indicated as Tdr. After all of the data of the data block 1 is stored in the data buffer 20, a transfer enable status is set in the status register 15S. The host 3 recognizes the status and fetches the data of the data block 1. With respect to the data blocks 2 to 4 as well, a process similar to the above is performed.

According to the example, during the controller 4 reads out the data of the data block 3 from, for example, the port on the transfer arbitrator 13 side of the data buffer 22, stores the read data into the SDRAM 5 (Tp to Tq) and, subsequently, stores the data stored in the SDRAM 5 into the data buffer 20 (Tq to Tr), the data of the next data block 4 is input from the port of the flash memory 2 side of the data buffer 22 to the data buffer 22 and the preceding data of the data block 2 is supplied from the port on the side of the host 3 of the data buffer 20 to the host 3. In short, in response to the read access request from the host 3, the controller 4 stores the read data into the SDRAM 5 and outputs the read data stored in the SDRAM 5 in a time sharing manner. In parallel with the process of storing the read data into the SDRAM 5, the host 3 can fetch the read data from the buffer memory 20. In parallel with the process of outputting the read data from the SDRAM 5, a process of inputting the next read data from the flash memory 2 to the buffer memory 22 can be performed.

Figure 10:
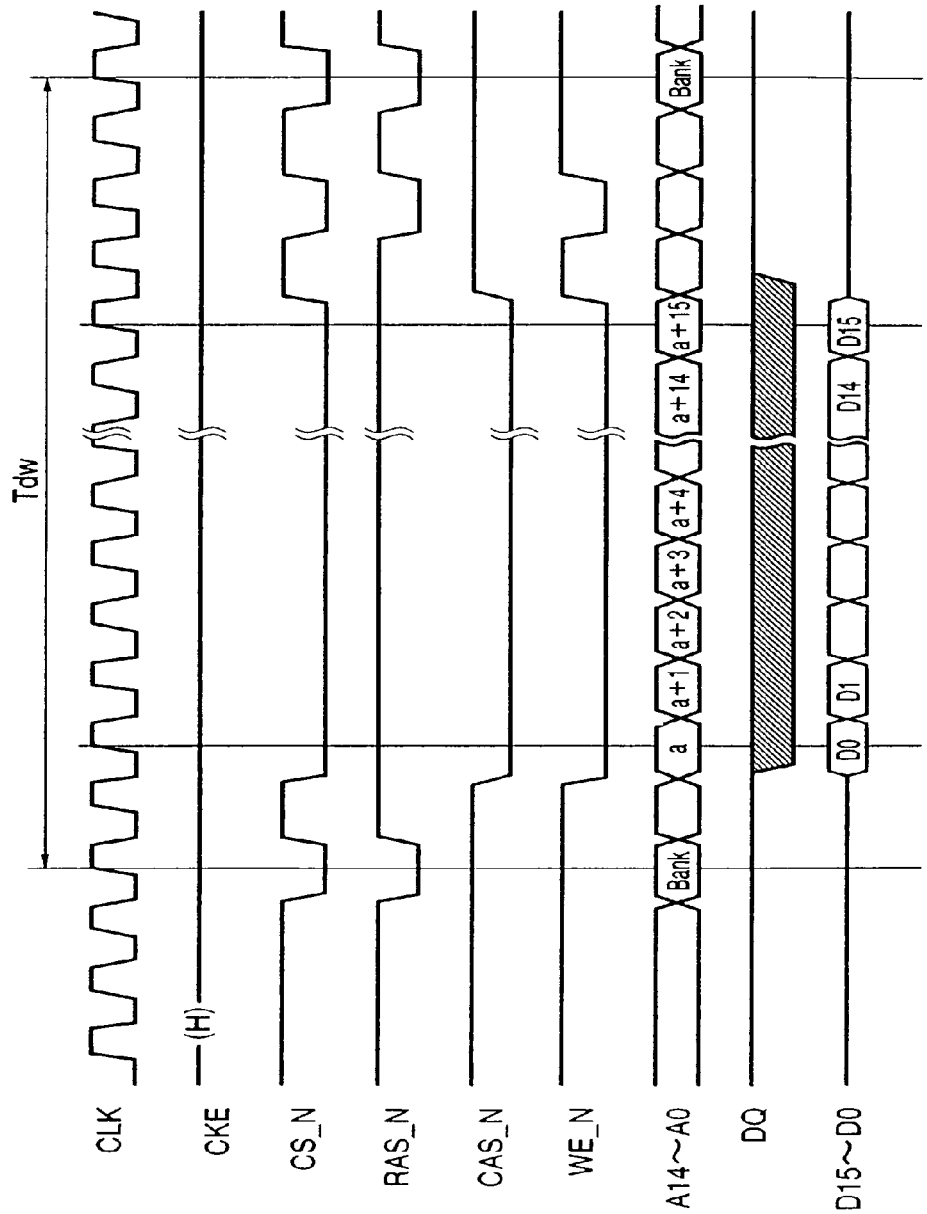
FIG. 10 is a timing chart showing an example of a write cycle Tdw of the SDRAM.

FIG. 10 shows an example of the write cycle Tdw of the SDRAM. Shown are a clock CLK corresponding to the clock D_CLK, a clock enable signal CKE, a chip select signal CS_N, a row address strobe signal RAS_N, a column address strobe signal CAS_N, a write enable signal WE_N corresponding to the signal D_WE, address signals A14 to A0, and data D15 to D0.

Figure 11:
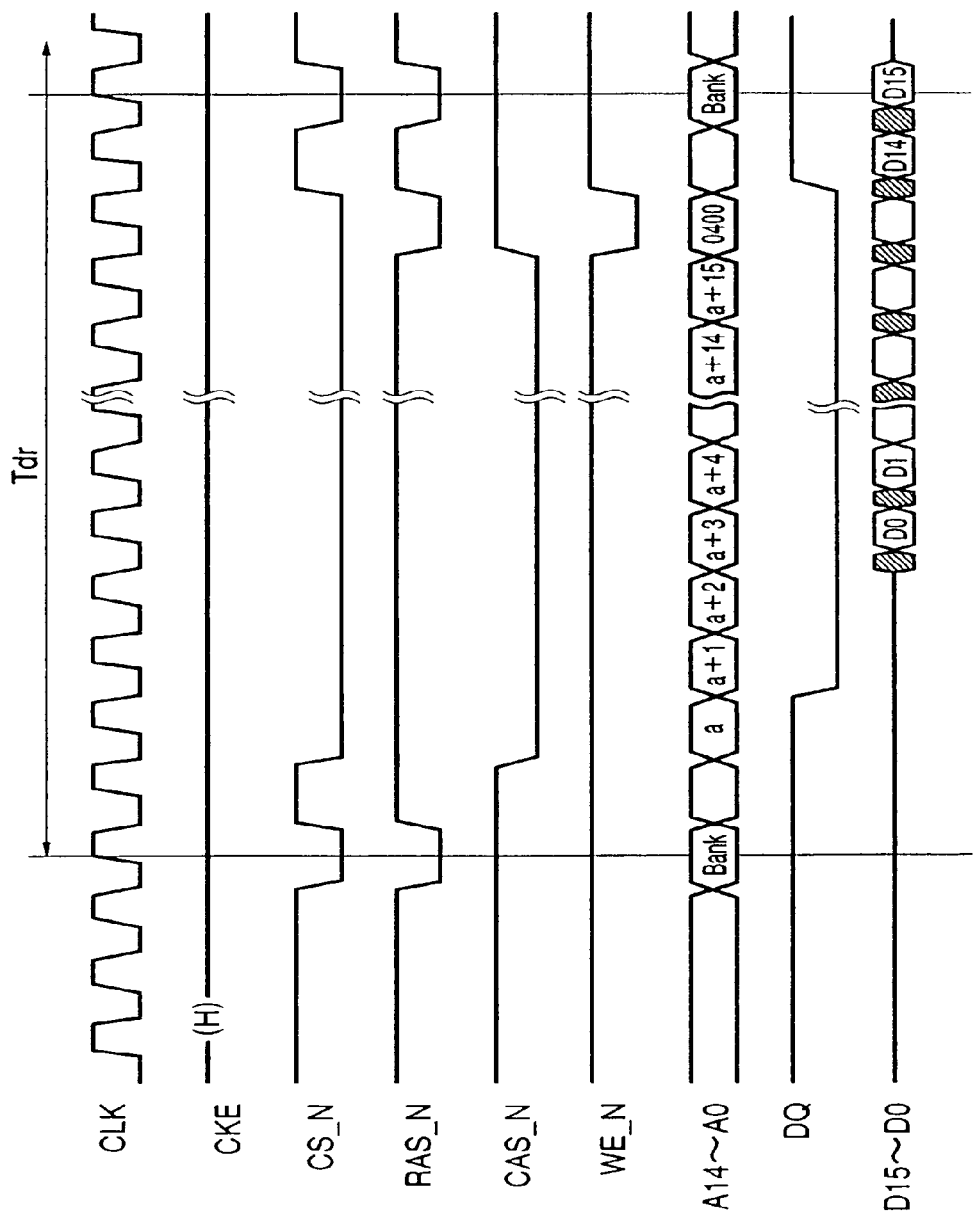
FIG. 11 is a timing chart showing an example of a read cycle Tdr of the SDRAM.

FIG. 11 shows an example of the read cycle Tdr of the SDRAM.

Figure 12:
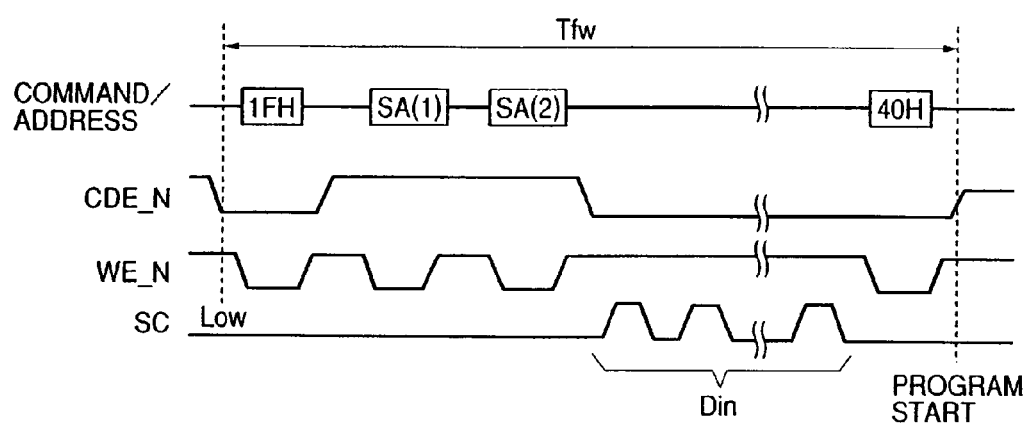
FIG. 12 is a timing chart showing an example of a write cycle Tfw of a flash memory.

FIG. 12 shows an example of the write cycle Tfw to the flash memory 2. 1FH denotes a write transfer command, SA(1) and SA(2) denote address values, and 40H indicates a write start command. Write data (Din) is input synchronously with a serial clock SC.

Figure 13:
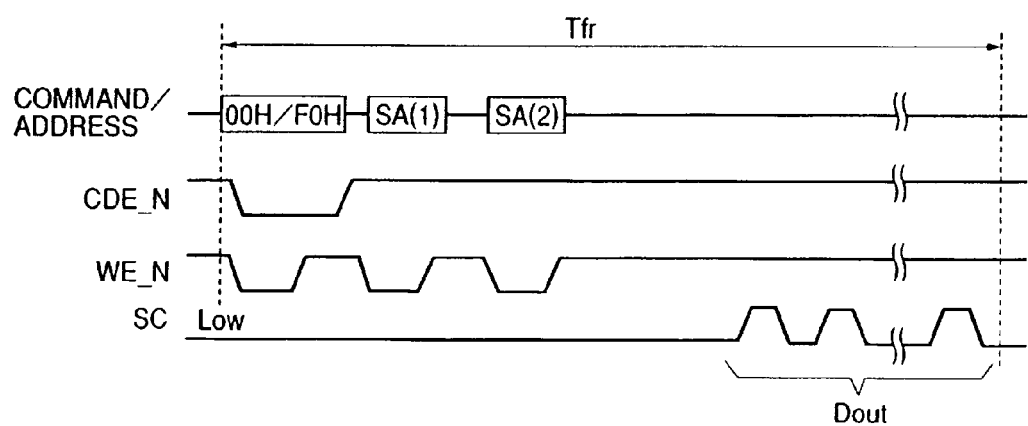
FIG. 13 is a timing chart showing an example of a read cycle Tfr of the flash memory.

FIG. 13 shows an example of the read cycle Tfr to the flash memory 2. 00H/F0H denotes a read transfer command and SA(1) and SA(2) denote address values. Read data (Dout) is output synchronously with the serial clock SC.

Figure 14:
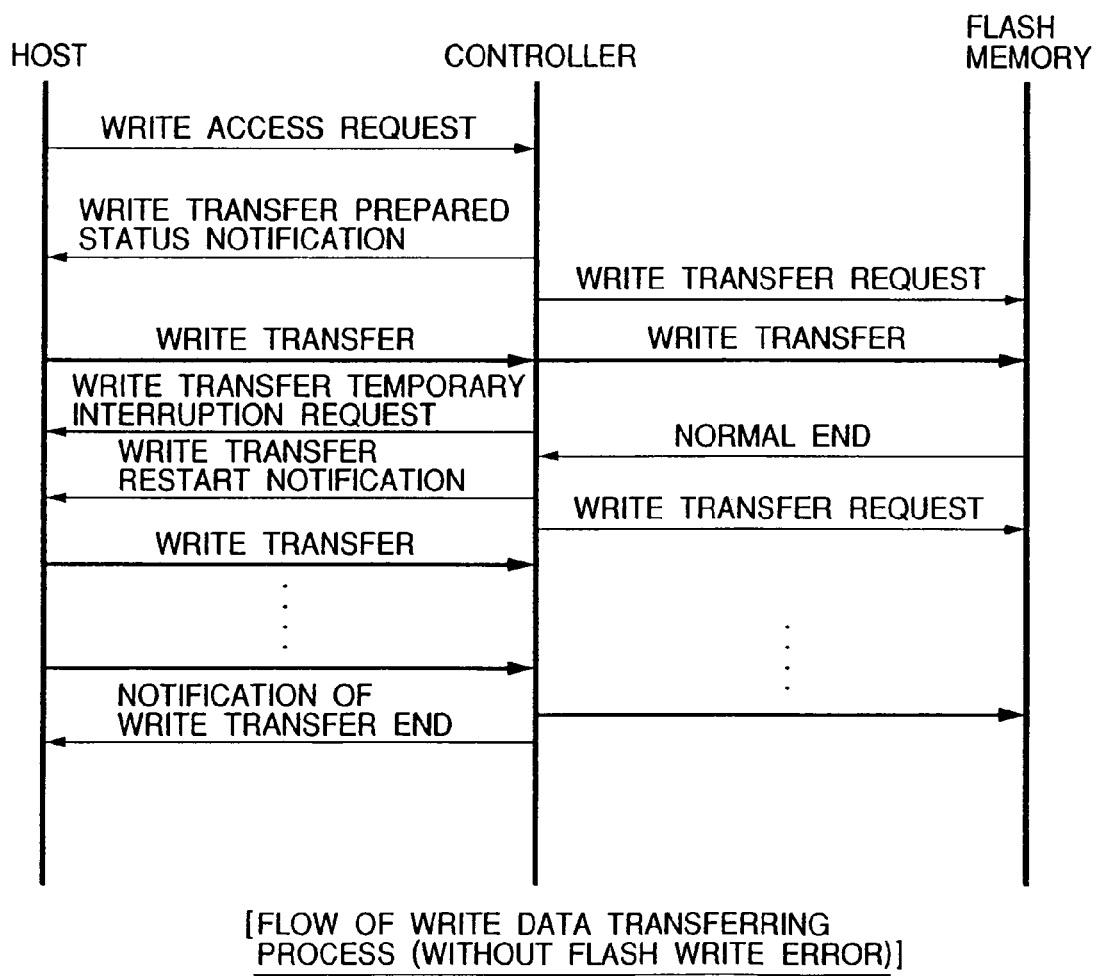
FIG. 14 is a flowchart showing a case where there is no write error in the flash memory in the flow of a data transferring process performed in response to a write access request.

FIG. 14 illustrates the flow of a data transfer process performed in response to a write access request. The process flow of FIG. 14 assumes a case where there is no write error in the flash memory 2. When a write access request is issued from the host 3, the controller 4 notifies the host 3 of a write transfer prepared status and sends a write transfer request to the flash memory 2. On receipt of the notification, the host 3 transfers write data to the controller 4 and the controller 4 transfers the write data to the flash memory 2. The flash memory 2 performs the writing operation and returns a normal end signal to the controller 4. In the case such that there is no allowance to store write data of a new block in the data buffer 20, the controller 4 asserts the signal HWAIT and sends a write transfer temporary interruption request to the host 3. When the write data of a new block becomes storable, the controller 4 negates the signal HWAIT and supplies a write transfer restart signal to the host 3. The host 3 restarts transferring write data to the controller 4 and the controller 4 restarts transferring the write data to the flash memory 2. After all of processes responding to the write access request are finished, the controller 4 sends a write transfer end notification to the host 3.

Figure 15:
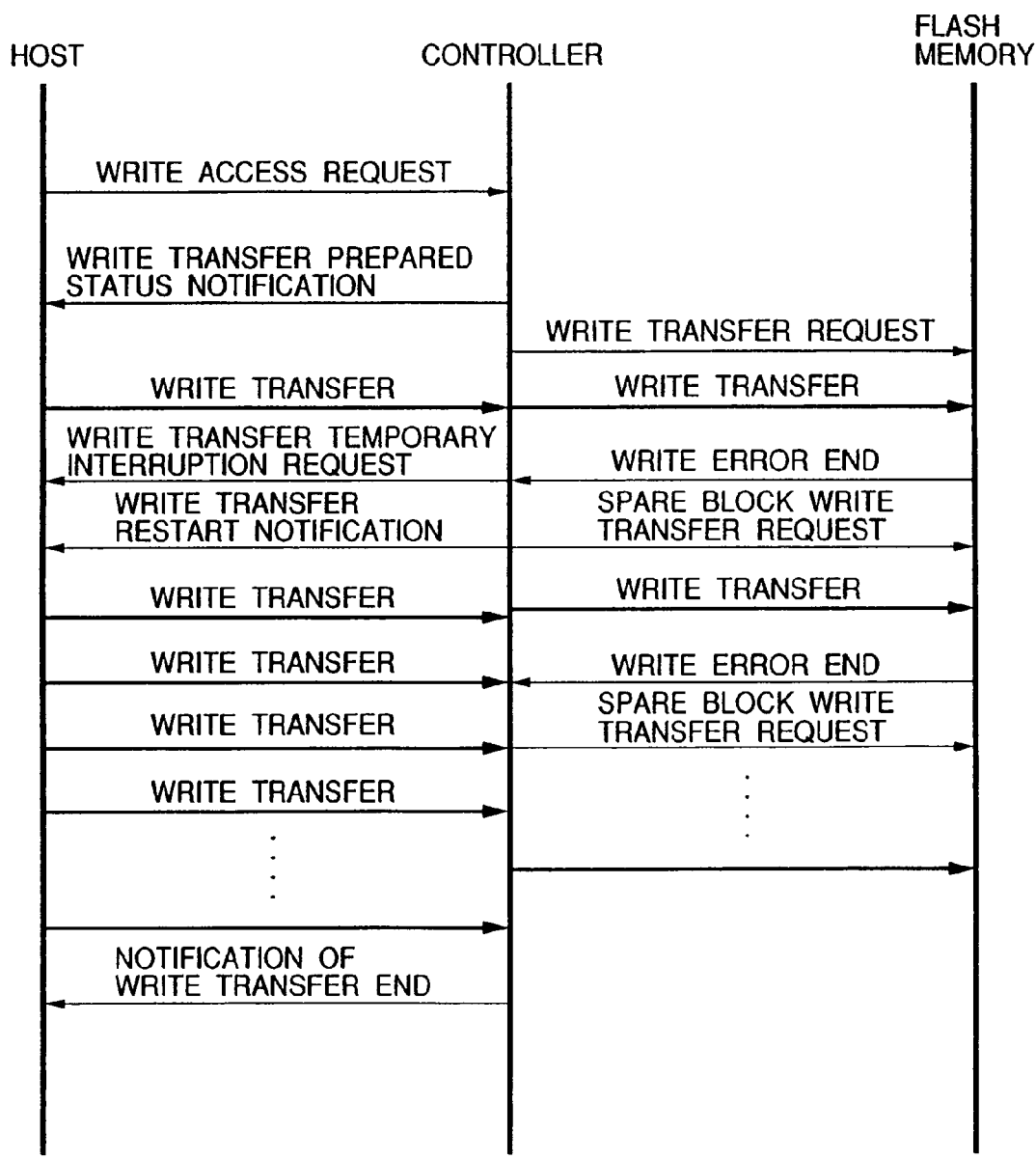
FIG. 15 is a flowchart showing a case where there is a write error in the flash memory in the flow of another data transfer process performed in response to the write access request.

FIG. 15 shows an example of the flow of another data transfer process performed in response to the write access request. The process flow in the diagram assumes that there is a write error in the flash memory 2. When a write access request is issued from the host 3, the controller 4 notifies the host 3 of a write transfer prepared status and sends a write transfer request to the flash memory 2. The host 3 receives the notification and transfers write data to the controller 4, and the controller 4 transfers the write data to the flash memory 2. The flash memory 2 performs a writing operation, in this example, a write error occurs, and the flash memory 2 notifies the controller 4 of a write failure end. The controller 4 receives the notification, asserts the signal HWAIT, and sends a write data transfer temporary interruption request to the host 3. After that, the controller 4 negates the signal HWAIT, notifies the host 3 of write data transfer restart, and sends a spare block write data transfer request to the flash memory 2. The host 3 transfers write data to the controller 4 and the controller 4 transfers the write data to the flash memory 2. In this example, the writing to the flash memory 2 fails again and a write error end is notified to the controller 4. After that, the controller 4 requests the flash memory 2 to perform the writing process which has failed. During the period, the host 3 can transfer the following write data to the controller 4 in advance. Finally, after all of processes responding to the write access request are finished, the controller 4 sends a write transfer end notification to the host 3.

Figure 16:
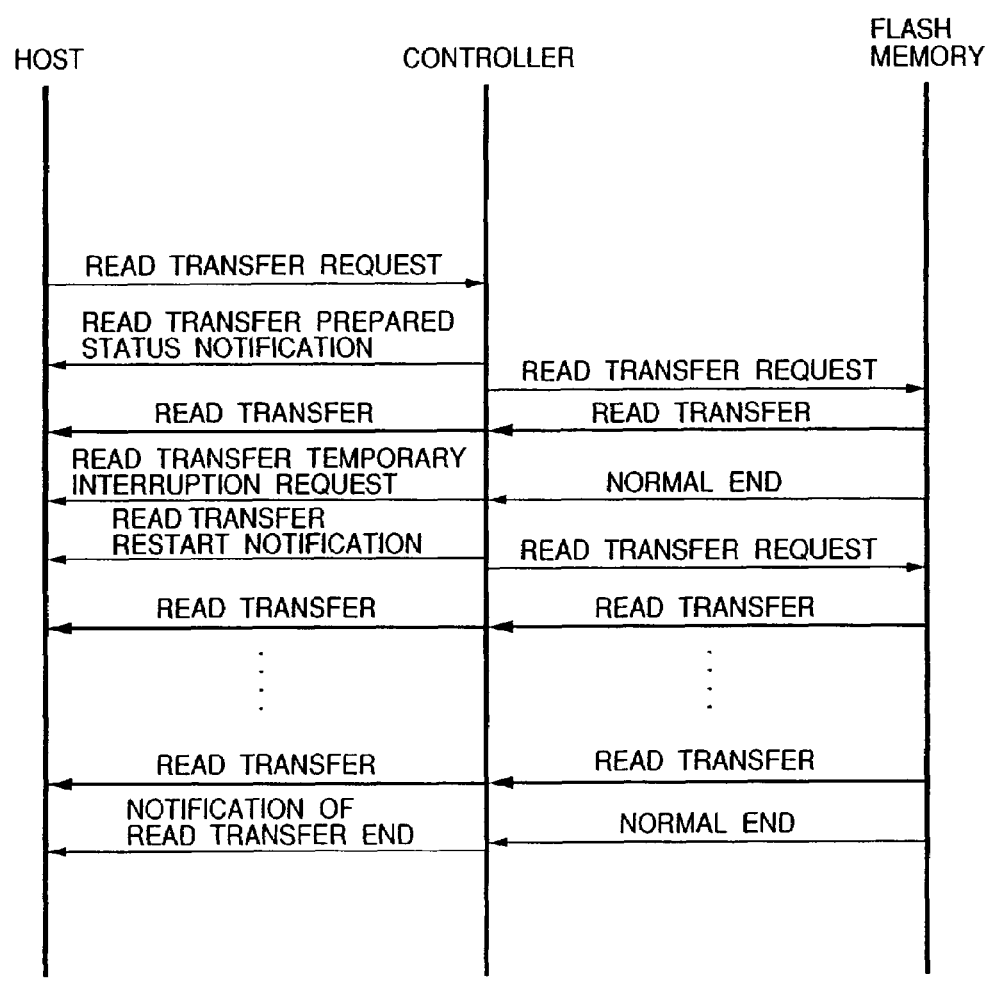
FIG. 16 is a flowchart of the flow of a data transferring process performed in response to a read access request.

FIG. 16 shows the flow of a data transfer process responding to a read access request. When a read access request is issued by the host 3, the controller 4 notifies the host 3 of a read transfer prepared status and sends a read data transfer request to the flash memory 2. The flash memory 2 receives the request and transfers read data to the controller 4. The controller 4 transfers the read data to the host 3. In this example, the flash memory 2 returns a normal end to the controller 4. In the case where there is no allowance of storing read data of a new block in the data buffer 20, the controller 4 asserts the signal HWAIT and sends a read transfer temporary interruption request to the host 3. When read data of a new block becomes storable, the controller 4 negates the signal HWAIT, requests the host 3 to restart transferring read data, and sends a read data transfer request to the flash memory 2. In a manner similar to the above, the flash memory 2 transfers read data to the controller 4 and the controller 4 transfers the read data to the host 3. After finishing all of processes responding to the read access request, the controller 4 notifies the host 3 of a read data transfer end.

By the buffering function using the SDRAM 5 of the controller 4, long waiting time is not required for the timing of supplying a plurality of write data pieces by the host 3, and long waiting time is not required for the timing of obtaining a plurality of read data pieces by the host 3. Therefore, the invention can contribute to reduction in waiting time of the host 3 regarding data transfer between the host 3 and the controller 4, reduction in a processing load, and reduction in process time. It can improve efficiency of the data process accompanying an access to the flash memory card 1.

Although the invention achieved by the inventor herein has been described concretely on the basis of the embodiments, obviously, the invention is not limited to the embodiments but can be variously changed without departing from the gist.

For example, the nonvolatile memory is not limited to a flash memory but may be a rewritable nonvolatile memory employing other storing methods such as a high-dielectric-constant memory. The number of information memory bits per memory cell is not limited to one bit but may be two or more bits. The memory system is not limited to a flash memory card such as a PC card but can be constructed on a processor board on which a data processor is mounted. The data buffer in the host interface part in the controller and the data buffer in the nonvolatile memory interface part are not limited to a dual-port type but may be a memory of a single port, a register, or a latch circuit. In short, any device may be used as long as data can be input/output in the host interface part or flash interface part in parallel with data transfer to a buffer memory in a time sharing manner.

Effects produced by representative ones of the inventions disclosed in the specification will be briefly described as follows.

In response to a write access request from the outside, the controller can store write data to the buffer memory and output the write data stored in the buffer memory in a time sharing manner. By using a data buffer of a dual port type, write data can be transferred to the nonvolatile memory (second data transfer) in parallel with the write data storing process, and the following write data from an external apparatus can be input (first data transfer) in parallel with the write data outputting process.

In response to a read access request from the outside, the controller can store read data to the buffer memory and output the read data stored in the buffer memory in a time sharing manner. By using a data buffer of a dual port type, read data can be transferred to an external apparatus (first data transfer) in parallel with the read data storing process, and the following read data from the nonvolatile memory can be input (second data transfer) in parallel with the read data outputting process.

In such a manner, long waiting time is unnecessary for the timing of supplying a plurality of write data pieces by an external apparatus such as a host, and long waiting time is unnecessary for the timing of obtaining a plurality of read data pieces by the host. Therefore, the invention can contribute to reduction in waiting time of the host in the data transfer between the host and a controller, reduction in a process load, and reduction in processing time. Thus, the efficiency of a data process accompanying a memory access can be improved.

What is claimed is:

1. A memory system comprising:
   a rewritable nonvolatile memory;
   a buffer memory; and
   a controller,
   wherein said controller controls, in response to an access request from an external apparatus, first data transfer between said controller and said external apparatus, second data transfer between said controller and said nonvolatile memory, and third data transfer between said controller and said buffer memory, controls transfer from said controller to said buffer memory and transfer from said buffer memory to said controller in said third data transfer in a time sharing manner, and enables said first data transfer or said second data transfer to be performed in parallel with the third data transfer carried out in the time sharing manner, wherein the time sharing manner includes performing transfer from said controller to said buffer memory and transfer from said buffer memory to said controller alternately on a predetermined data unit basis.

2. The memory system according to claim 1, wherein operation speed of said third data transfer is about twice as high as data transfer speed of said first data transfer.

3. The memory system according to claim 2, wherein the buffer memory is a single-port clock-synchronous volatile memory and operates in an FIFO manner.

4. The memory system according to claim 3, wherein said controller comprises a dual-port data buffer disposed between said external apparatus and the buffer memory and a dual-port data buffer disposed between said buffer memory and said nonvolatile memory.

5. The memory system according to claim 4, wherein a nonvolatile memory is a flash memory.

6. A memory system comprising:
a rewritable nonvolatile memory;
a buffer memory; and
a controller,
said controller including:
a first data transfer control unit connected to an external apparatus;
a second data transfer control unit connected to said nonvolatile memory; and
a transfer arbitrator which is connected to said buffer memory and controls data transfer to/from the buffer memory in response to a transfer request from said first data transfer control unit and a transfer request from said second data transfer control unit,
wherein said first data transfer control unit is connected to the external apparatus and the transfer arbitrator via a data buffer and outputs a transfer request to the transfer arbitrator,
wherein said second data transfer control unit is connected to the nonvolatile memory and the transfer arbitrator via a data buffer and outputs a transfer request to the transfer arbitrator, and
wherein the transfer arbitrator controls transfer of write data to said buffer memory and transfer of read data from said buffer memory in a time sharing manner in response to a transfer request from said first data transfer control unit and a transfer request from said second data transfer control unit,
wherein the time sharing manner includes performing transfer of write data to said buffer memory and transfer of read data from said buffer memory alternately on a predetermined data unit basis.

7. The memory system according to claim 6, wherein said data buffer has dual ports.

8. The memory system according to claim 6, wherein in response to a write access request from the outside, said first data transfer control unit outputs a transfer request for writing data to the buffer memory to the transfer arbitrator when a predetermined amount of data is stored in the data buffer from the external apparatus, and said second data transfer control unit outputs a transfer request for reading data from the buffer memory to the data buffer to the transfer arbitrator when data in the data buffer is less than the predetermined amount.

9. The memory system according to claim 6, wherein in response to a read access request from the outside, said second data transfer control unit outputs a transfer request for writing data to the buffer memory to the transfer arbitrator when a predetermined amount of data is stored in the data buffer from the buffer memory, and said first data transfer control unit outputs a transfer request for reading data from the buffer memory to the transfer arbitrator when data in the data buffer is less than the predetermined amount.

10. The memory system according to claim 6, wherein operation speed of the data transfer to/from the buffer memory by said transfer arbitrator is about twice as high as operation speed of data transfer to/from the outside by said first transfer control unit.

11. The memory system according to claim 9, wherein the buffer memory is a single-port clock-synchronous DRAM and operates in an FIFO manner.

12. The memory system according to claim 10, wherein the nonvolatile memory is a flash memory.

13. A nonvolatile memory system comprising:
a controller;
a buffer memory;
a nonvolatile memory;
a first signal line connected to the controller, for transferring data to/from the outside;
a second signal line connecting the controller to the buffer memory; and
a third signal line connecting the controller to the nonvolatile memory,
wherein a data transfer rate of said second signal line is equal to or higher than a sum of a data transfer rate of said first signal line and a data transfer rate of said third signal line,
wherein in the case of storing data supplied from the outside into said nonvolatile memory, in said second signal line, transfer of data which is supplied from the outside and temporarily stored in the buffer memory and transfer of data which is temporarily stored in the buffer memory and is stored into said nonvolatile memory are performed in a time sharing manner, that is, alternately on a predetermined data unit basis,
wherein in the case of supplying data stored in said nonvolatile memory to the outside, in said second signal line, transfer of data which is read from said nonvolatile memory and temporarily stored in the buffer memory and transfer of data which is temporarily stored in the buffer memory and is supplied to the outside are performed in a time sharing manner, that is, alternately on a predetermined data unit basis.

14. The nonvolatile memory system according to claim 13, wherein the data transfer rate of said first signal line is equal to or higher than the data transfer rate of said third signal line.

15. The nonvolatile memory system according to claim 14, wherein a clock signal line is included in said second signal line, and said buffer memory is a memory to/from which data is input/output synchronously with a clock signal.

16. The nonvolatile memory system according to claim 13, further comprising a plurality of said nonvolatile memories, and a data transfer rate of said third signal line is equal to a sum of data transfer rates of said plurality of nonvolatile memories.

17. The nonvolatile memory system according to claim 16, wherein the data transfer rate of said first signal line is equal to or higher than the data transfer rate of said third signal line.

18. The nonvolatile memory system according to claim 17, wherein a clock signal is included in said second signal line, and said buffer memory is a memory to/from which data is input/output synchronously with a clock.

19. The nonvolatile memory system according to claim 18, wherein in the case of storing data supplied from the outside into said nonvolatile memory, in said second signal line, transfer of data which is supplied from the outside and temporarily stored into the buffer memory and transfer of data which is temporarily stored in the buffer memory and stored into any of said plurality of nonvolatile memories are performed in a time sharing manner.

20. The nonvolatile memory system according to claim 18, wherein in the case of supplying data stored in said nonvolatile memory to the outside, in said second signal line, transfer of data which is read from any of said plurality of nonvolatile memories and temporarily stored into the buffer memory and transfer of data which is temporarily stored in the buffer memory and supplied to the outside are performed in a time sharing manner.

* * * * *